United States Patent
Menegoli et al.

(10) Patent No.: US 7,863,841 B2
(45) Date of Patent: Jan. 4, 2011

(54) CLASS H DRIVE

(76) Inventors: Paolo Menegoli, 859 Juliet Ave., San Jose, CA (US) 95127; Carl Sawtell, 3595 Cropley Ave., San Jose, CA (US) 95132

( * ) Notice: Subject to any disclaimer, the term of this patent is extended or adjusted under 35 U.S.C. 154(b) by 550 days.

(21) Appl. No.: 11/949,184

(22) Filed: Dec. 3, 2007

(65) Prior Publication Data

US 2008/0310046 A1  Dec. 18, 2008

Related U.S. Application Data

(60) Provisional application No. 60/934,613, filed on Jun. 15, 2007.

(51) Int. Cl.
    *H02P 6/00* (2006.01)
(52) U.S. Cl. ............. 318/400.29; 318/293; 318/400.26; 318/400.27; 318/400.28
(58) Field of Classification Search ................ 318/293, 318/400.26–400.29
    See application file for complete search history.

(56) References Cited

U.S. PATENT DOCUMENTS

| | | | |
|---|---|---|---|
| 3,426,290 A | 2/1969 | Jensen | |
| 4,054,843 A | 10/1977 | Hamada | |
| 4,087,759 A | 5/1978 | Iwamatsu | |
| 4,218,660 A | 8/1980 | Carver | |
| 4,378,530 A | 3/1983 | Garde | |
| 4,409,559 A | 10/1983 | Amada et al. | |
| 5,075,634 A | 12/1991 | French | |
| 5,200,711 A | 4/1993 | Andersson | |
| 5,396,194 A | 3/1995 | Williamson | |
| 6,104,248 A | 8/2000 | Carver | |
| 6,166,596 A | 12/2000 | Higashiyama et al. | |
| 6,304,138 B1 | 10/2001 | Johnson | |
| 6,847,182 B2 | 1/2005 | Ricotti | |
| 7,034,490 B2 * | 4/2006 | Sawtell et al. | 318/569 |
| 7,142,436 B1 * | 11/2006 | Chen et al. | 318/400.29 |
| 7,224,135 B1 | 3/2007 | Menegoli et al. | |
| 2007/0164814 A1 * | 7/2007 | Wendt et al. | 330/10 |

* cited by examiner

*Primary Examiner*—Bentsu Ro
*Assistant Examiner*—Erick Glass

(57) ABSTRACT

A method for driving a load by using an output stage amplifier in full bridge configuration whose supply is modulated by means of a fast switching power converter, controlled in order to maintain the stage's output common mode at its minimum voltage, is presented. The modulation of the switching power converter output is obtained by a feedback control system regulating directly the voltage of the bridge output stage terminals. This bridge unipolar class H stage allows driving the load with high accuracy and improved efficiency without introducing switching noise and EMI at the load terminals typical of PWM driving. This method can be applied with the same benefits to class AB, pseudo class AB or to class A output stages. When this method is associated with an imposed current driving approach and with a current oversampling digital to analog converter the resulting advantages are very significant for accurate motor control applications.

20 Claims, 7 Drawing Sheets

CLASS H DRIVE

RELATED APPLICATION DATA

The present application claims priority from U.S. Provisional Patent Application No. 60/934,613 for "CLASS H DRIVE" filed on Jun. 15, 2007.

BACKGROUND OF THE INVENTION

1. Field of the Invention

The present invention is in the field of high efficiency amplifiers. The present invention is also in the field of actuator drivers and controllers. The present invention further relates to motor controllers. The present invention further relates to Hard Disk Drives and optical data storage devices. The present invention further relates to methods and circuits for controlling a voice coil motor for positioning the read/write head of a hard disk drive. The implementation is not limited to a specific technology, and applies to either the invention as an individual component or to inclusion of the present invention within larger systems which may be combined into a larger integrated circuit.

The invention also falls within the field of integrated circuits to drive a loudspeaker, an actuator or a motor.

2. Brief Description of Related Art

The physical kinetic parameters of a motor such as velocity and acceleration are directly linked to its torque which, in its turn, is directly dependent on the current applied to the motor itself. That is why most motors are driven in current by means of a control loop that senses the current in the motor and regulates it according to a desired value.

In several fields the accurate control of position, velocity and acceleration of a motor is critical to the overall performance of the system. Some of these fields are: the hard disk drive applications, the optical data storage motor positioning applications, the digital still camera applications to control focus, zoom and other dedicated motors, the printer applications, the robotics and others.

The position of the read/write head of a disk drive is typically controlled by a linear motor, often referred to as the Voice Coil Motor (VCM) that moves a mechanical arm over the disk surface. The VCM 4, as shown in FIG. 1, is represented as an inductor L1 in series to a resistor R1 to indicate the main electrical parameters of the motor. This representation does not include the Back Electromotive Force (BEMF) that is generally represented as a series voltage generator whose value is dependent on the velocity of the motor. The VCM is driven in response to a control loop, known as the servo loop, whose main algorithm is implemented typically within a microprocessor or similar digital processor, and is typically driven in at least three different modes.

A "seek" mode causes the read/write head to move from one track on the disk to a potentially unrelated track, which may require a significant motion. In this mode, the control system typically attempts to control the velocity of the mechanism. In "track follow" mode, the read/write head is relatively stationary, and the control system works to control its precise position to be directly above the appropriate track. In a third mode, the head is driven onto or off of the disk surface to a "park" position, typically using a mechanical ramp to pull the head above the surface of the disk.

As shown in FIG. 1, the VCM control system comprises a serial port 1 that communicates with the microprocessor that contains the main servo algorithm and that drives, with digital signals, a digital to analog converter (DAC) 2. This DAC 2 typically drives a VCM actuator 11 in its various forms and implementations. The VCM actuator 11 commands the current into the VCM 4 which defines its arm's velocity and position on the disk surface.

In addition to the servo loop there is, typically, an inner analog current control loop that drives the VCM as shown in more details in FIG. 1. The serial port 1 drives a Digital to Analog Converter (DAC) 2 which, in its turn, commands the current through the inner current control loop. In this case the VCM actuator block 11 comprises the inner analog current control loop to regulate the current into the VCM 4.

In order to obtain optimal control, the overall servo loop commands a particular current to be driven into the VCM, and an inner analog control loop regulates the current. Practical circuit implementation considerations require that the VCM be driven with conventional amplifiers which impose a voltage across the VCM. The local analog control loop senses the current in the VCM, compares it to the commanded current, and adjusts the drive voltage to maintain the desired current.

The inner analog control loop is driven by a DAC 2 creating an analog representation of the digitally commanded current, and a Current Sense Amplifier (CSA) 5 generates a signal representing the instantaneous value of the VCM current. These two signals are summed at the input of the error amplifier 6 via resistors R2 and R3 respectively, and this sum is the error in the value of the current. The voltage reference 3 sets the common mode voltage at the load.

The error amplifier 6 is conventionally an integrator, with arbitrarily high gain at DC but with gain falling with frequency to maintain the stability of the loop at higher frequencies. This stage might also implement additional frequency/phase shaping for stability. Such frequency response shaping is controlled by C1, C2 and R4, as is well known in the art. The output of error amplifier 6 feeds the pseudo class AB stages 9 and 10 which are typically constituted of two antiphase linear amplifiers 7 and 8, coupled to a "full bridge" capable of applying the full supply voltage across the load in either polarity. The linear amplifiers 7 and 8, even if not depicted in details in FIG. 1 for simplicity, are typically configured as closed loop amplifiers with a constant gain defined by feedback resistors. In series with the VCM 4 there is a power resistor R5 used to sense current. The voltage across this current sense resistor R5 is used as the differential input to the current sense amplifier 5.

Within this loop, the error amplifier is a large bandwidth standard operational amplifier. The DC errors can be initialized out of the loop with software, during the so called "calibration phase" and the AC requirements are generally met with conventional design techniques. The VCM power amplifiers 7 and 8 are similarly very conventional in design. Typical Class AB stages are implemented with complementary components biased with a stand-by current in order to achieve very low zero-cross distortion.

Zero-cross distortion is an important parameter to measure the ability of the driver to exhibit zero current in the motor when zero current is desired. The so-called "jumps" or "deadbands" in the transfer function of the amplifier are highly undesirable and typically minimized by the use of class AB stages. When the stages are biased in a similar manner using non-complementary components, as is often the case for the integrated motor driver circuits, they are generally known as pseudo-class AB amplifiers.

The overall analog control system, including DAC, current sense amplifier, error amplifier and power amplifiers is typically implemented on a single chip, usually along with the control and power stage for the disk drive spindle motor actuator and any other analog/power functions required in the system. The resultant chip's efficiency is determined by the efficiency of all the subsystems, but in particular the product of current and voltage for the output transistors in the diverse conditions of the motor drive is the main contributor to the power dissipation in the chip.

In the case of the VCM, depending on the modes of operation, the drive may be more or less efficient. Typically in "track follow" mode the current is not very significant, but the voltage might be (depending on the voltage common mode of the output stage). In "track follow" the current is mainly due to the fact that the arm of the VCM has to overcome the spring force of the flexible connector that carries the conductors for the pre-amplifier located on the tip of the arm, therefore the current is depending on the location of the arm, whether it is closer to the center or to the outer track of the disk. In "seek" mode the current is quite high, but the voltage between drain and source of the power transistors of the bridge output stage is generally not very high, since they are typically operating in the triode region.

Generally the maximum power dissipation occurs during the transition between these two main modes of operation and more specifically during the acceleration and deceleration of the VCM arm, when the product of current and voltage applied to the power stages in the chip is significant also for effect of the back electromotive force. In fact, in order to optimize the mechanical response of the motor and minimize the seek time a pseudo-sinusoidal profile is given to the current in the motor.

Nowadays several efforts are increasingly made to improve the overall efficiency of the motor drive especially for the case of battery operated disk drive or more generally motor drives. Class AB amplifiers, although featuring low overall distortion, are constantly biased at a not negligible stand-by current that, if combined with high voltage drop, constitutes a considerable power loss.

The utilization of PWM switching approaches, such as driving a motor in class-D or with more traditional PWM control loops, introduces high frequency switching noise that can interfere with the operation of the device. Furthermore the magnetic losses in the motor due to high frequency switching at its terminals may negatively impact the overall system efficiency. In the case of the VCM, the Hard Disk Drive manufacturers have been reluctant to employ these approaches despite of their recognized advantages in terms of reduced power dissipation.

The proliferating use of miniature precision motor drive in battery operated devices is posing two formidable related problems: a) extending the time between charges and b) being able to dissipate the necessary power in order to keep the device temperature within reasonable ranges.

The solution to both these problems is to find accurate and more efficient means to drive the motors. In particular for brushless DC motors used in Hard Disk Drive and data storage devices, as well as in digital still cameras, the efficiency is becoming a very critical aspect of their overall performance. The typical case could be the VCM of the Hard Disk Drive. In this case, even for desktop applications, that are not battery operated, the efficiency is increasingly an important factor due to the fact that higher processor speeds, within the personal computer case, tend to raise the temperature rapidly.

The use of PWM motor drives that apply an average voltage at the terminals of the motor driving fully on or fully off the power transistors at frequencies in the range of 100 KHz to a few MHz is very well known to those skilled in the art. However these schemes have several disadvantages such as higher harmonic distortion, higher complexity, high magnetic losses in the motor and most importantly the Electro Magnetic Interference (EMI) effects generated by the fast voltage rising and falling edges at the motor terminals.

In particular, the EMI has limited the use of switching drive methods in cases like the Voice Coil Motor drive especially in "track follow". The proposed invention makes use of output stages (typically in full bridge configuration) that get current from a modulated supply voltages controlled by a feedback control system in order to operate with the minimum bridge common mode voltage (CMV) so as to guarantee very low distortion even in presence of varying BEMF.

The output stage power supply is modulated by a switching converter to obtain high efficiency. This configuration is similar to the not widely known class H stage amplifiers. The switching converter could be a step up or a step down converter and in particular, in order to obtain good efficiency in all the load conditions, it is advantageous to apply a step down conversion in a manner analogous to the operation of a buck converter.

The first official document describing a rudimentary approach similar to what is nowadays known as class H output stage, is Jensen (U.S. Pat. No. 3,426,290). Jensen in 1965 described a system to modulate the power supplies of an amplifier by means of a switching regulator circuit to minimize the dissipation in the output stage.

Similarly Hamada (U.S. Pat. No. 4,054,843) in 1976 described a simple step down converter to modulate the supply of an emitter follower stage implemented with bipolar transistors depending on the input signal amplitude. Although this implementation does not provide the performances of modern class H amplifiers, it certainly characterizes the main concept.

Several other tracking power supply systems have been disclosed in Iwamatsu (U.S. Pat. No. 4,087,759) issued May 2, 1978, Carver (U.S. Pat. No. 4,218,660) issued Aug. 19, 1980, Garde (U.S. Pat. No. 4,378,530) issued Mar. 29, 1983 and Amada et al. (U.S. Pat. No. 4,409,559) issued Oct. 11, 1983. In all these examples the dual supplies are controlled by means of signals derived by the input signal to be amplified.

French (U.S. Pat. No. 5,075,634) describes a bridge output stage whose supply voltage is generated by a PWM (Pulse Width Modulation) open loop system controlled by the input signal. The main signal path to the amplifier is delayed by a delay stage to allow sufficient time to the tracking supply to react to a fast amplitude change of the signal.

Further similar approaches of amplifiers having dual modulated power supply rails based on the amplitude of the input signal are disclosed in Andersson et al. (U.S. Pat. No. 5,200,711), Williamson et al. (U.S. Pat. No. 5,396,194), Carver (U.S. Pat. No. 6,104,248) and Higashiyama et al. (U.S. Pat. No. 6,166,596).

A slightly different approach is disclosed in Johnson (U.S. Pat. No. 6,304,138). Johnson describes a bridged output stage whose supply voltage is first selected between two separate rails and then modulated by the voltage present at the output terminals of the bridge stage. This method constitutes a rather inefficient means of minimizing power dissipation because the dissipation is simply transferred to the controlling MOSFET (520 in FIG. 5) connected to the high voltage rail, operating in its linear region, when the amplifier power is not supplied by the lower voltage rail. In addition this system may cause start up problems certainly not acceptable for motor control systems.

Ricotti (U.S. Pat. No. 6,847,182) describes a method to increase the power supply voltage of a motor drive system above its BEMF (back electromotive force) by means of a boost circuit.

With the exception of Ricotti all the above-mentioned documents describe prior art class H amplifiers that are mainly used in audio applications. The present invention proposes a class H full bridge stage whose power is supplied by means of a fast power converter controlled by a feedback system. The closed loop control system guarantees that the common mode voltage at the output terminals of the bridge amplifier is regulated at an optimal voltage.

Although the proposed invention is mainly directed at precision motor drivers, it may generally be utilized for various applications (including audio) and it differentiates from all the prior art for the fact that its unique and very effective approach does not utilize the input signal to determine the amplitude of the modulated supply voltage in an open loop configuration. This represents a valid alternative to PWM schemes and class D amplifiers.

In the Hard Disk Drive (HDD) systems the density of the magnetic data recorded on the disk is increasing very rapidly and that is translated in the number of rotational tracks per inch on the disk surface. The tracks containing the magnetic data are consequently getting narrower and the burden to stay on track with limited Bit Error Rate (BER) during normal operation is shifted to the ability to control the position of the head on the disk with increasing accuracy.

It is therefore advantageous to reduce as much as possible the sources of electrical noise in the overall drive control loop so that the effective dynamic range is improved. Furthermore the switching noise at the motor terminals introduced by conventional PWM schemes may result unacceptable in the case of data storage systems that utilize magnetic media.

Accordingly, what is needed is a motor actuator that drives the motor with accuracy and high efficiency while maintaining very low cross-over distortion and without introducing the undesirable EMI effects typical of switching amplifiers (class-D) and of Pulse Width Modulation systems in general when the motor terminals are switching at high frequencies.

SUMMARY OF THE INVENTION

It is an objective of the present invention to provide a general full bridge amplifier stage whose power supply is modulated by a fast switching power converter driven by a feedback system that controls the voltage drop at the drain of the conducting low side transistors thus regulating the bridge common mode voltage at a desired voltage. The switching frequency of the power converter is much higher than the frequency of the signal to be amplified.

It is another objective of the present invention to provide a VCM driver that improves upon the efficiency of the motor drive while maintaining a linear amplifier approach for the output stage. The utilization of PWM or PSM (Phase Shift Modulation) switching approaches, such as driving a motor in class-D or with more traditional PWM control loops, introduces high frequency switching noise that can interfere with the operation of the device. In the case of the VCM, the Hard Disk Drive manufacturers are reluctant to employ these approaches despite of their advantages in terms of reduced power dissipation.

One of the main advantages of the described configuration is the fact that it resolves the important problem of efficiency and power dissipation without degrading the resolution of the motor drive or the accuracy of the control and without adding much complexity and cost.

It is another objective of the present invention to provide a VCM driver, or more generally a motor driver, that combines the advantage of higher efficiency with the direct imposition of a current in the motor by selecting its polarity based on the DAC digital input therefore removing the DC error sources. This would eliminate the calibration phase, reducing the time needed to start the hard disk drive operation.

It is another objective of the present invention to provide a VCM driver, or more generally a motor drive, that combines the above mentioned advantages with a "current" oversampling digital to analog converter to replace the most traditional voltage DAC in order to reduce the total current consumption of the chip, its die size and complexity and more importantly to increase the resolution of the motor control.

It is another objective of the present invention to provide a high efficiency, low distortion motor drive independently from the amplitude and frequency of the BEMF (back electromotive force) induced in the motor.

The power stage of a VCM motor drive is typically configured as a full bridge, with two low side drivers and two high side drivers. The full bridge configuration allows the application of the full current to the load in both directions. The high side transistors may be P-type MOS or DMOS devices or N-type MOS or DMOS devices.

In one of its embodiments, as represented in FIG. 2, the present invention employs the traditional full bridge with the addition of two more power devices connected in series between the main supply and ground to implement a synchronous switching power converter. Typically these power devices may be implemented with MOS transistors and are alternatively turned on and off during operation.

A hysteretic or pseudo-hysteretic control type could be implemented for the switching power converter. A control signal from an operational amplifier feeds the power converter control block to modulate the supply voltage of the power bridge. The operational amplifier guarantees that selected internal node voltages be regulated at a desired voltage. The bridge power devices may be driven in class AB or, more simply, in class A obtaining very low cross-over distortion.

The embodiment of FIG. 2 is very similar to the one of FIG. 1 with a current control loop and all its elements: the serial port, the DAC, the current sense amplifier and the error amplifier. In addition an operational amplifier 13 is depicted with two inverting inputs to indicate that the lowest voltage input is the one being regulated at any one time. The lowest voltage input is the bridge output whose low side transistor is conducting. The operational amplifier 13 controls the switching power converter 15 in order to regulate the voltage of the bridge's output conducting low side to be substantially equal to the voltage reference 12. The voltage reference is selected to guarantee that the low side power transistor operates at the edge of the triode and saturation regions. This implies that the voltage across the conducting power transistors is always the minimum necessary to effectively drive the load thus minimizing the total power dissipation. The control block 14 converts its input signal into the appropriate duty cycle to drive the power transistors M5 and M6 of the converter 15.

The pseudo class AB stages 9 and 10 are maintained in the linear region so as to eliminate completely the EMI associated with driving the load terminals with switching waveforms. Similarly to the case of FIG. 1, the linear amplifiers 7 and 8, even if not depicted in details in FIG. 2 for simplicity, are typically configured as closed loop amplifiers with a constant gain defined by feedback resistors. During fast load transients the feedback system has to be fast enough to make sure that the output transistors always have sufficient voltage overhead to drive the load without introducing harmonic distortion. This is achieved by the means of hysteretic approaches for the power converter, high switching frequencies and low value inductances for the inductor L2. Clearly, one of the key requirements for the linear power stages is the good PSRR (Power Supply Rejection Ratio) to make the amplified signal immune to possible fast variation of the voltage at the node designated as "VBRIDGE".

Modern silicon process technologies allow the implementation of efficient high frequency switching power converters. That implies the use of small inductors and filter capacitors with very low output voltage ripple. This also allows the converter output voltage to respond quite rapidly to needed variations. Since the converter inductor is several orders of magnitude smaller than the motor inductance, a current change in the load can be obtained without any delay in the switching converter.

The switching power converter transistors M5 and M6 have to be able to carry the full load current with the maximum voltage. In fact, in the case of the VCM motor drive, during full seek mode of operation, the maximum current has to be applied to the motor, which implies that all the available voltage has to be provided to the bridge supply to overcome the BEMF of the motor. Although the silicon area associated with these two extra power devices is not negligible, modern BCD and CMOS silicon process technologies allow the implementation of cost effective power stages.

Selecting the voltage reference 12 appropriately, guarantees that the efficiency of this class H amplifier can be comparable to the efficiency of a class D switching amplifier, with the advantage of lower distortion and no direct EMI (Electro-Magnetic Interference) at the load terminals. In fact class D amplifiers utilized for motor drives have to take into consideration also the magnetic losses associated with applying switching waveforms at the motor terminals.

In a further embodiment of the present invention as depicted in FIG. 3, the class H operation can be achieved by eliminating the inner current control loop as described in Menegoli et al. (U.S. Pat. No. 7,224,135). In this proposed implementation an additional MOS transistor M9 is connected in series to the bridge low side devices to impose the load current in response to a current digital to analog converter. This device M9 is part of a power current mirror that can be implemented in various ways in order to achieve the requested accuracy and linearity.

This additional transistor M9 does not add to the total series resistance of the load, with respect to the more traditional approach, because generally an external power resistor (of approximately 250 mohms) is used to sense the current. This sense resistor contributes significantly to the voltage drop at the load, limiting the maximum motor current and the "seek" time and it is no longer needed in the present approach. Modern CMOS process silicon technologies allow the utilization of 200 mohm on-resistance low voltage NMOS devices without requiring a very large silicon area.

The regulation of the drain voltage of the transistor M9 at a selected low voltage allows the use of low voltage MOS devices. The benefits of using low voltage transistors are various such as smaller die size, higher Rdson, but more importantly higher accuracy of the power current mirror since its transistors' output impedance is not critical.

In this configuration a first operational amplifier 22 drives the high side power transistors in order to regulate the common mode voltage of the full bridge stage to be at a desired voltage. This desired voltage is set by the resistor divider composed of resistors R8 and R9 across the supply of the full power bridge. The voltage at the node between the resistors R10 and R11, typically set to have equal resistance, is the common mode voltage at the load terminals. This topology guarantees that the power stage can drive a motor load regardless of the present BEMF. The BEMF voltage is algebraically summed to the voltage applied to the load without altering the load current to be imposed.

A second operational amplifier 21 regulates the voltage at the drain of the power transistor M9 by modulating the voltage at the node VBRIDGE by means of the switching power converter 15. As a consequence of this voltage regulation, the additional power current mirror devices M8 and M9 can be implemented as low voltage MOS transistors. Two switches S1 and S2 driven by the MSB of the DAC determine which high side of the bridge has to be conducting current, determining the polarity of the load current.

In addition to the removal of the current control loop, this implementation allows further circuit simplification because the low side transistors M1 and M2 are also driven "digitally", either fully on or fully off by the blocks 18 and 19, controlled by the MSB of the digital to analog converter digital input, and because the mirroring of the current is limited to only one power mirror.

This embodiment of the present invention simplifies enormously the implementation of the VCM driver with the advantages of lower noise, higher efficiency, very low distortion, no need for initial offset calibration phase, faster response to the commanded digital current signal, smaller silicon area, simplified testability, less external components and excellent motor drive resolution, particularly when the DAC is implemented utilizing oversampling techniques as described in Sawtell et al. (U.S. Pat. No. 7,034,490).

In a further embodiment of the present invention, as shown in FIG. 4, the voltage at the node VBRIDGE is modulated by regulating the voltage at the power bridge output terminals to be substantially equal to a voltage reference when their corresponding low side transistors are conducting. The high side power transistors are driven by a common mode voltage feedback circuit, similarly to the previously described embodiment.

The two low side power transistors are switched based on the polarity of the load current, but particular attention has to be made to the zero-cross distortion. It should be noted that the latency of the analog signal path through the current mirror has to be equivalent to the latency introduced in the digital signal path to prevent dynamic jumps in the transfer function. Conventional circuit techniques can be applied to obtain very low zero-cross harmonic distortion.

Provided that the common mode voltage feedback and the class H feedback circuits be unconditionally stable, it is significant to note that the elimination of the current regulation loop implies the inherent stability of the system, the reduced current consumption yielding to higher efficiency and the faster response to the commanded signal to the DAC because the application of the motor current is set by an open loop circuit and it is not delayed by the prior art integrator time constant.

It is also noteworthy that the bridge common mode output voltage feedback allows excellent current control even in presence of varying BEMF, and in addition higher efficiency than the traditional class AB output stages can be obtained because the voltage across the low side output transistors conducting the motor current is minimized. It is also advantageous that the drains of the conducting low side drivers are regulated to be at a low voltage because this way excellent current regulation can be achieved independently from the high transconductance of the output device of the power current mirror.

As is clear to those skilled in the art, this basic system can be implemented in many specific ways, and the above descriptions are not meant to designate a specific implementation. For example dual power current mirrors could be employed to obtain analogous results. Similarly, this basic system has been described with particular attention to the Hard Disk Drive applications, but it can also be implemented more generally for the control of any other motor or of any load of different nature such as for audio or DSL applications, as broadly represented in FIG. 7.

BRIEF DESCRIPTION OF THE DRAWINGS

Further details of the present invention are explained with the help of the attached drawings in which.

DETAILED DESCRIPTION OF SPECIFIC EMBODIMENTS

A. FIG. 2

Figure 2:
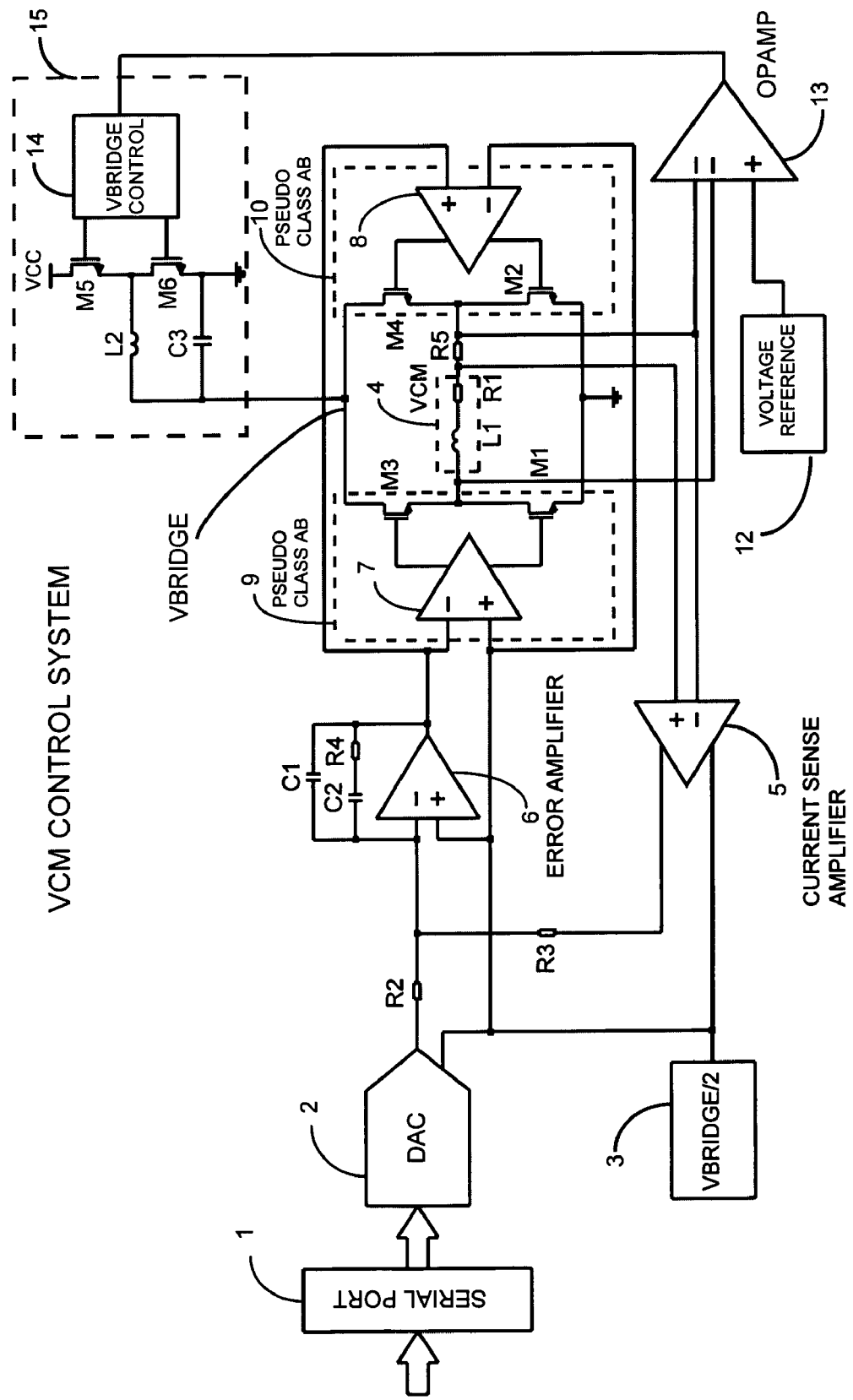
FIG. 2 is a circuit diagram showing a general detailed implementation of the basic VCM control system in accordance with the present invention.

FIG. 2 shows a general embodiment for the basic VCM driver control system utilizing a class H drive system. The pseudo class AB stages 9 and 10 drive the gates of the low side power transistors M1 and M2, and the gates of the high side power transistors M3 and M4 electrically coupled to the bridge supply node designated as VBRIDGE. A switching power converter 15 provides power to the bridge.

Figure 1:
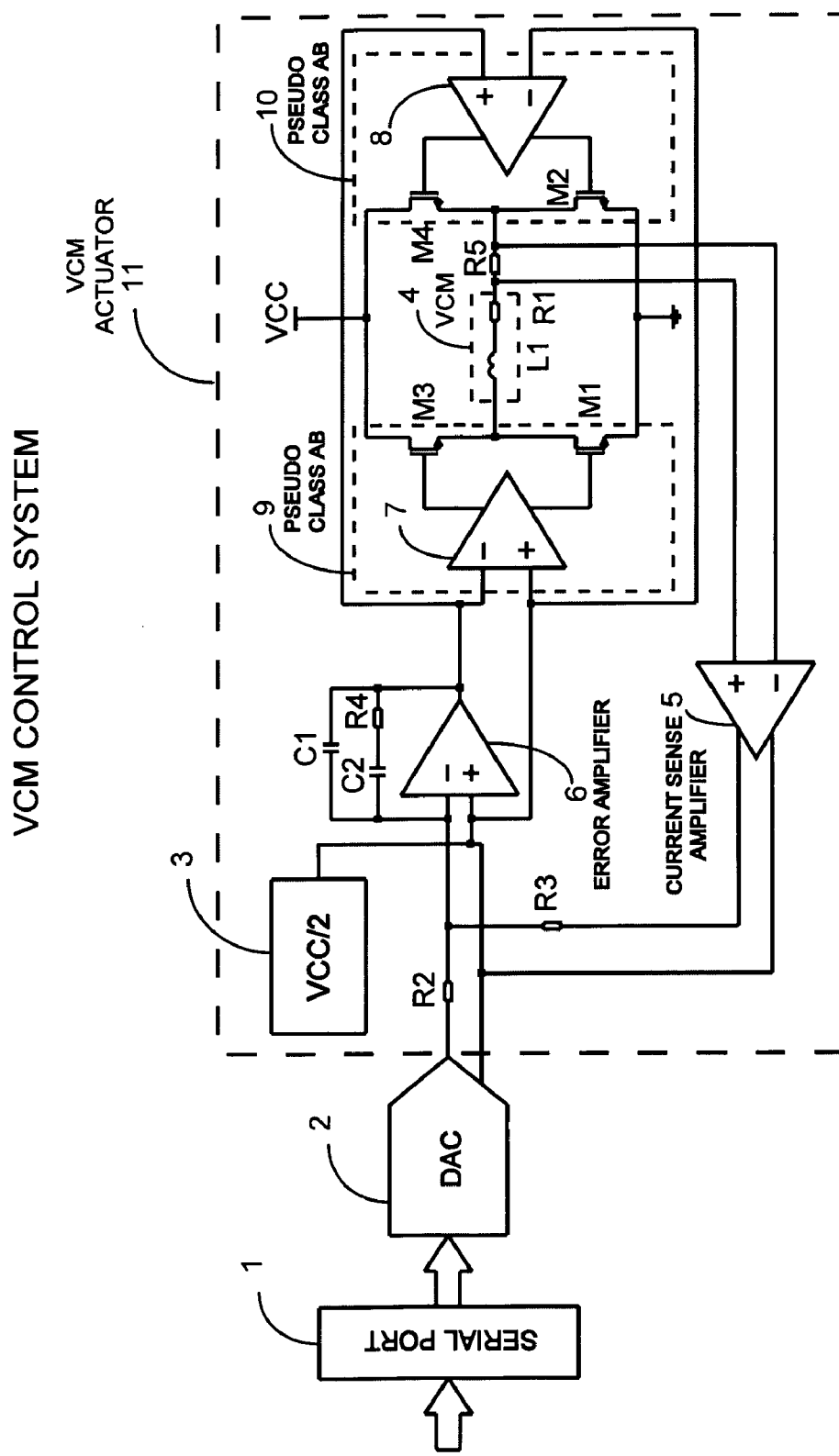
FIG. 1 is a general block diagram showing the prior art of the disk drive VCM control system.

The embodiment of FIG. 2 is very similar to the classical implementation of the prior art described in FIG. 1, since there is an inner current control loop that regulates the load current sensed as the voltage drop on the resistor R5 and amplified by the operational amplifier 5. An error amplifier 6 drives the output power stage and operates to null the error signal defined as difference between the output of the sense amplifier 5 and the output of the DAC 2 whose input is fed by the serial port 1. A voltage reference 3 sets the output common mode voltage. In this configuration the power stage is implemented as an unipolar bridge amplifier.

It should be noted that similarly to the prior art case of FIG. 1 the whole current control loop is referred to a common mode voltage VBRIDGE/2, but in this case, due to the continuous modulation of the voltage at the node VBRIDGE depending on the load conditions, the DAC 2 and the sense amplifier 5 have to be able to sustain large and fast common mode voltage variations without affecting their performance.

The power transistors are designated in FIG. 2 as NMOS transistors, but the same functions can be implemented utilizing bipolar transistors or PMOS transistors as well. The power devices may be driven in a conventional class AB or, more simply in class A in order to obtain low total harmonic distortion. What constitutes the class H and determines its advantages is the fact that the voltage at the node VBRIDGE is modulated by the switching power converter 15 in response to the voltage at the output terminals of the bridge power circuit so as to minimize the bridge common mode voltage and therefore operate with high efficiency.

The operational amplifier 13, that feeds the switching power converter 15, is represented with two inverting inputs to indicate that only the lowest voltage input is the one being regulated. When the required voltage across the load is increased, as in the case of seek mode operation, the class H feedback control circuit regulates the voltage at the drain of the conducting low side power transistor by requesting a higher duty cycle from the control block 14 of the switching power converter 15 and therefore by increasing the effective voltage at the node VBRIDGE. In this condition higher current will be provided to the load but more current from the switching power converter 15 will also be used to charge the capacitor C3 at higher voltage.

It is therefore clear that the dynamic performance of the converter and its ability to respond swiftly to an increased load condition is critical. Higher switching frequency power converter and consequently lower inductance value inductors and smaller capacitors are required to achieve adequate load transient response. Modern silicon process technologies allow the implementation of high frequency converters without significantly degrading the overall system efficiency.

The feedback constituted by the amplifier 13 and the switching power converter 15 guarantees that the drain-source voltage for the bridge low side conducting transistor is equal to the voltage reference 12. Since the pseudo class AB amplifiers 9 and 10 are typically configured as closed loop amplifiers with a constant gain defined by feedback resistors and since the common mode voltage of the loop tracks the VBRIDGE voltage, the drain-source voltage for the high side conducting transistor is equally regulated to be the voltage reference 12. When the required load current is zero, the VBRIDGE voltage will be minimum and equal to two times the voltage reference 12.

The voltage reference 12, designated as fixed voltage in FIG. 2 can be implemented as a variable voltage depending on the operation of the motor control or more in general as function of the input signal so as to operate, for example, the low side transistors in triode region during seek operation. Alternatively and more simply the drain of the conducting low side power transistor could be kept a voltage such that the device operates at the edge between its saturation region and its triode region.

During track follow operation high resolution motor drive is required to precisely control the VCM head on the hard disk tracks during read/write operation. According to the present invention, during track follow, the current to the motor is provided by a linear stage operating at a reduced bridge power supply voltage, thus eliminating the switching noise introduced by conventional class D stages.

B. FIG. 3

Figure 3:
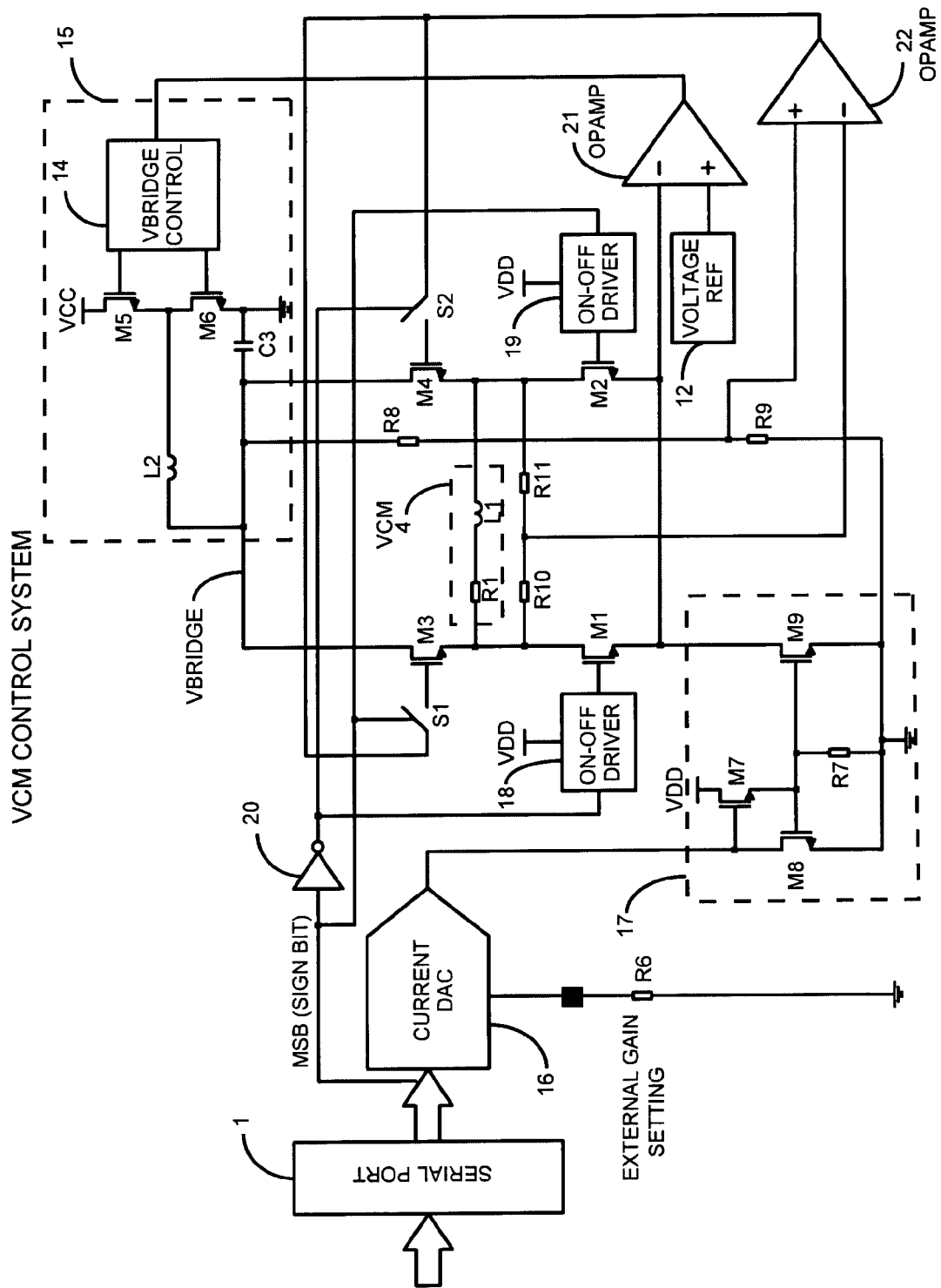
FIG. 3 is a circuit diagram showing a more detailed implementation of the VCM control system with load current imposition technique and common mode voltage feedback in accordance with a preferred embodiment of the present invention.

FIG. 3 shows a preferred embodiment of the present invention where the bridge class H output stage is combined with the "imposed current" technique to remove the inner current control feedback. The shown VCM control system makes use of a Current Digital to Analog converter 16 whose output is in the form of an analog current whose value is set by the digital input of the DAC 16. This analog current is adjusted through an external resistor R6 and subsequently mirrored into the full power bridge to drive the desired current in the VCM 4.

The full bridge is configured with two high side power transistors M3 and M4 electrically coupled to the power converter 15, and with two low side power transistors M1 and M2. The full bridge configuration allows the application of the full current to the load in both directions. The high side transistors may be P-type MOS or DMOS devices or N-type MOS or DMOS devices. The load current is set by the current mirror 17.

The devices M8 and M9 constituting the power current mirror 17 are sized differently in order to achieve the desired current ratio between the reference current, output of the current DAC 16, and the output current value. The large size of the device M9 typically implies that the mirror's gate capacitance is proportionally significant, therefore a small reference current would limit the speed of a traditional current mirror. The transistor M7 and the resistor R7 increase the bandwidth of the current mirror with respect to its simplest and more conventional topology.

The low side transistors M1 and M2 are driven simply by turning the devices fully on or fully off. The signal that commands the low side drivers 18 and 19 can be derived from the MSB of the digital input of the DAC 16, since this bit represents the polarity of the current. The extraction of the MSB of the digital input has the effect to simplify the current output DAC 16, because the DAC output is simply a positive current.

The resistor R6, that can conveniently be external to the integrated device, is setting the gain of the servo loop. Since the current DAC 16 is working in one direction only, a true zero current should be passed to the load 4 when zero load current is commanded. This implies that no DC offset is present and therefore the calibration phase, traditionally employed in conventional VCM systems, is no longer necessary. This configuration, if implemented appropriately, also guarantees a zero-cross distortion comparable to the one achieved by the more conventional class AB stage.

The current imposed in the motor is given by the ratio of the size of the transistors M8 and M9, however sometimes, especially when using DMOS transistors, it may be difficult to achieve the desired size of the reference transistor in relation to the size of the power transistor. This could lead to a current matching error which translates into a gain error in the system. Generally, this gain error is automatically corrected by the servo loop, but it could also be trimmed, in the integrated circuit, in several manners to obtain the desired gain.

It is important to note that when the maximum current in the VCM 4 is required, as is often the case for the seek mode operation, a high current is also flowing in the reference device M8 of the mirror 17 and generally, if the mirror transistors are sized properly, the gate voltage of the output transistor M9 is high enough to drive M9 in the triode region with minimum on-resistance. However, when either the maximum DAC digital input or an analog threshold is reached, an additional circuit that turns on a device to pull the gate voltage of the mirror output transistor to the maximum allowed voltage could be added. That would guarantee that the transistor M9 is fully turned on in that specific condition.

The operational amplifier 22 drives the high side power transistors M3 and M4 in order to regulate the common mode voltage of the full bridge stage to be at a desired voltage. This desired voltage is set by the resistor divider composed of resistors R8 and R9 across the full bridge power. The voltage at the node between the resistors R10 and R11, typically set to be of equal resistance, is the common mode voltage at the load terminals. This topology guarantees that the power stage can drive a motor load in presence of a varying BEMF. The BEMF voltage is algebraically summed to the voltage applied to the load without altering the load current to be imposed.

The operational amplifier 21 commands the switching power converter 15 in order to regulate the drain voltage of the mirror output transistor M9 to be at the same voltage of the voltage reference 12. This offers several advantages: it allows the use of low voltage rating MOS transistors for both of the current mirror devices, it guarantees a better current matching since the output impedance of the current mirror is not so critical and it keeps the conduction state of the transistor M9 at the edge of the triode and the saturation regions. Furthermore if the DC gain of the operational amplifier 21 is high enough, the transfer function of load current versus input signal amplitude is guaranteed to be very linear.

The voltage regulation of M9 drain is obtained by driving the power devices M5 and M6 of the switching power converter 15 to modulate their duty cycle in order to control the voltage at the node VBRIDGE accordingly. The power converter control block 14 may be implemented as a hysteretic or pseudo-hysteretic control system to receive an analog input signal and convert it into a high frequency variable duty cycle signal to alternatively drive the power transistors M5 and M6. The high side drivers M3 and M4 are selected through the switches S1 and S2 commanded by the MSB of the digital input of DAC 16 and the signal at the output of the inverter 20.

The elimination of the current loop that includes the error amplifier, the sense amplifier, and their associated external components simplifies significantly the implementation but, most importantly, makes the solution inherently stable, faster (not limited to the frequency compensation of the error amplifier), free of DC voltage offsets that normally require an initial calibration phase, smaller in die area, more easily testable, and certainly more accurate in particular when the DAC 16 is implemented as an oversampling converter.

C. FIG. 4

Figure 4:
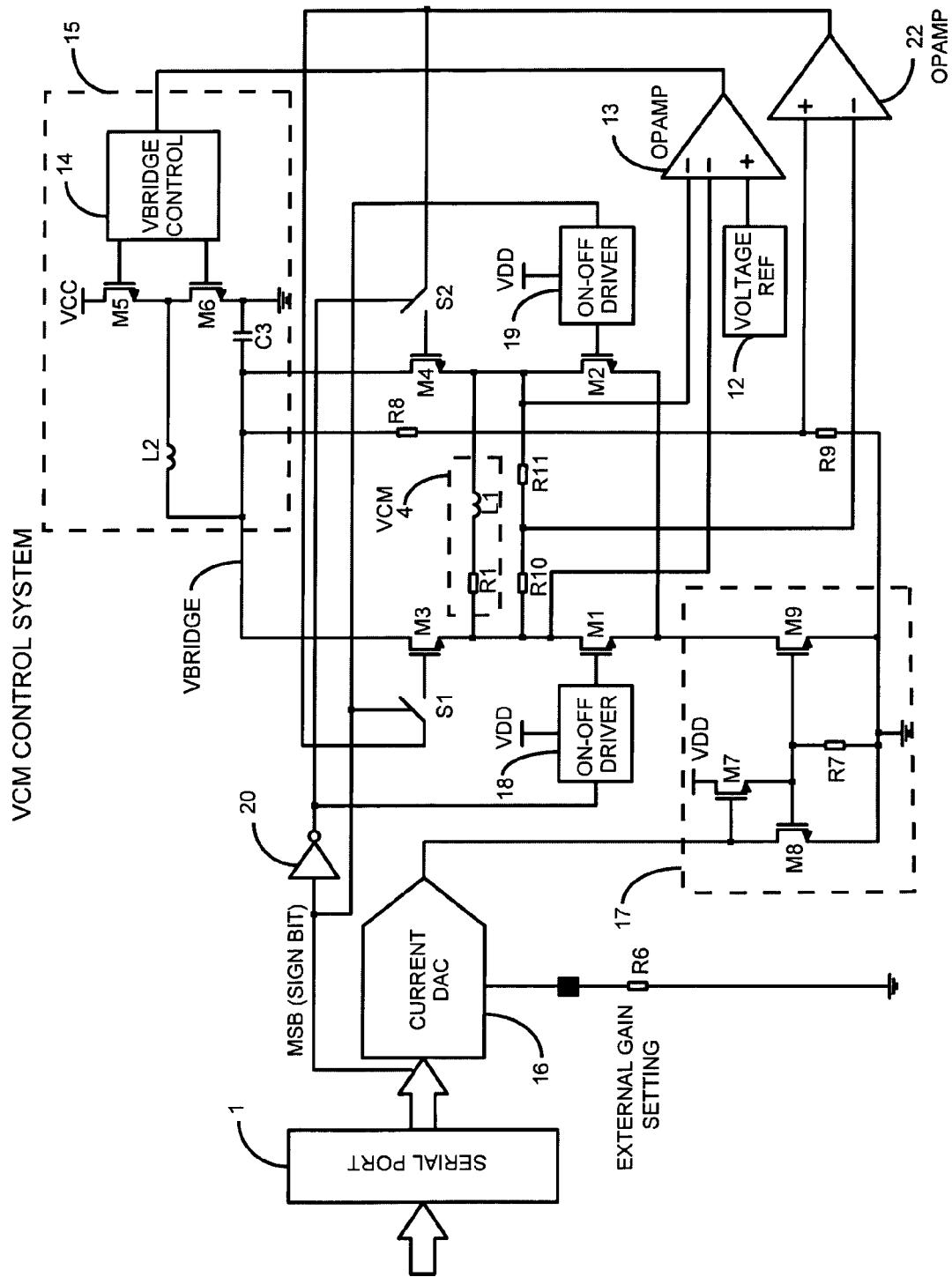
FIG. 4 is a circuit diagram showing a detailed implementation of the VCM control system with load current imposition technique and common mode voltage feedback in accordance with another embodiment of the present invention.

The embodiment of FIG. 4 shows another implementation of the class H bridge stage combined with the mirroring of the current into the power devices and into the load similarly to the embodiment of FIG. 3. In this embodiment the operational amplifier 21 of FIG. 3 is replaced by the operational amplifier 13. The control of the switching power converter 15 is obtained by regulating directly the voltage of the drain of the bridge conducting low side transistors similarly to the implementation of FIG. 2.

The operational amplifier 13 is designated as a two inverting input operational amplifier to indicate that at anytime the lowest voltage of the two inverting inputs is the one that gets regulated to be at the same voltage as the voltage reference 12. Similarly to the implementation of FIG. 3, the fact that the drain voltage of the conducting low side devices is regulated at low voltage guarantees that the current imposed by the power current mirror 17 is not dependent on its output impedance and it is therefore more linearly dependent on the input signal.

The representation of FIG. 4 is clearly only to depict the concept and more details may be needed to complete the implementation. For example the transistor M5 may be controlled to be fully on during the "power off ramp loading" operation to guarantee correct parking of the head when the power to the Hard Disk Drive is switched off.

As is clear to those skilled in the art, this basic system can be implemented in many ways, and the above description is not limited to a specific implementation. For example the described configurations can be extended to the case of multiple phase motors (as the spindle motor in the Hard Disk Drives) driven by multiple half bridge stages in analogous manners to the ones described.

Analogous known techniques make use of current mirrors and accurate voltage regulating circuits in various configurations. However, it is clear that the motor control may be implemented by imposing a current in the motor with closed loop bridge class H stages constituted of a modulated power supply controlled by a switching power converter in response to one or more voltages at the output terminals of the bridge in order to minimize its common mode voltage at all conditions, as in the above described embodiments.

D. FIG. 5

Figure 5:
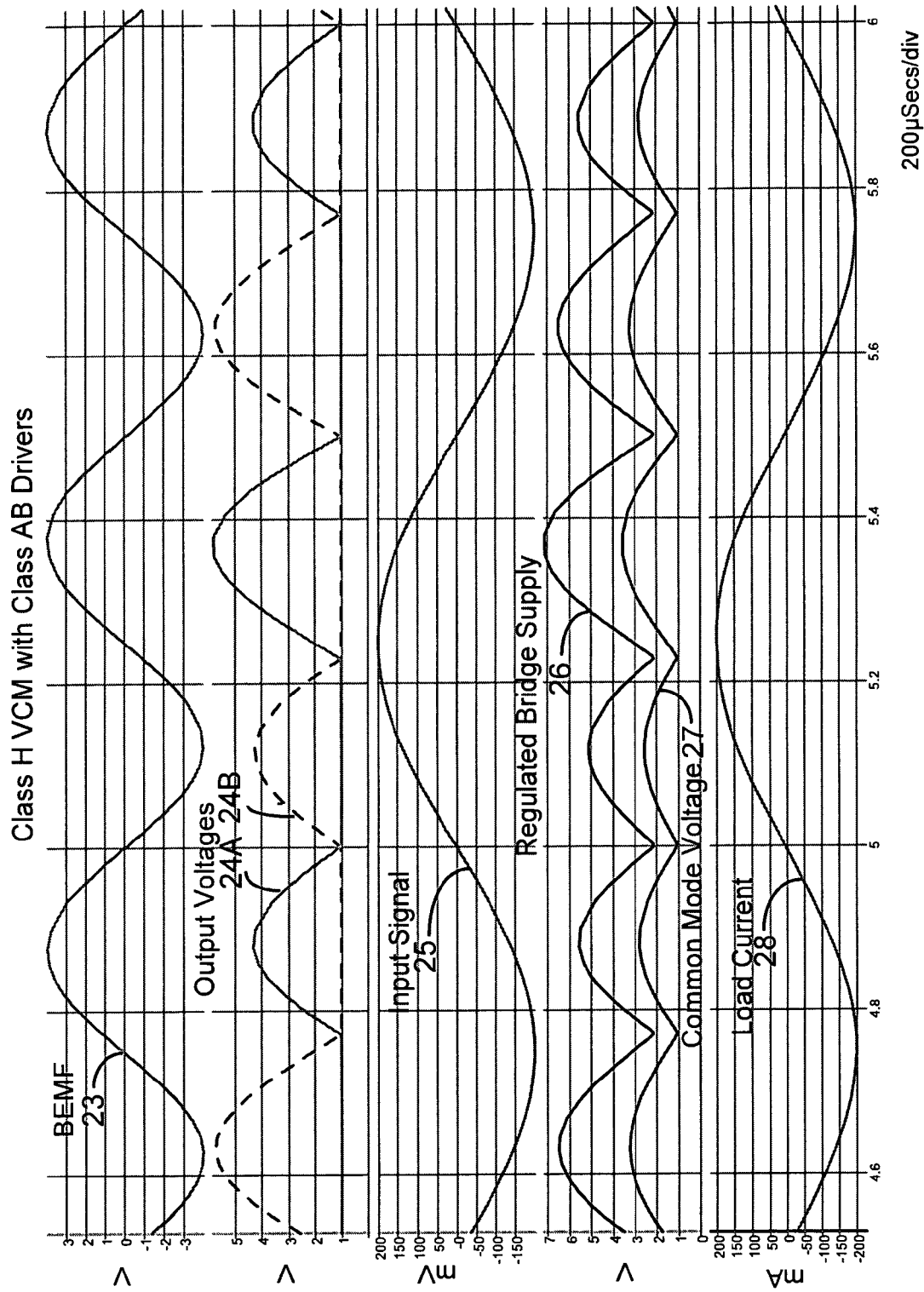
FIG. 5 is showing the most important waveforms of the class H stage of a VCM drive system in the case of sinusoidal input signal and higher frequency sinusoidal BEMF voltage in relation to the embodiment of FIG. 2.

FIG. 5 depicts the main waveforms for the embodiment of FIG. 2 for the case of a sinusoidal input signal, higher frequency sinusoidal BEMF voltage 23 and zero inductance of the motor. The input signal, indicated as the voltage at the input of the error amplifier 6 of FIG. 2 with respect to the VCC/2 voltage is represented in FIG. 5 with waveform 25. The waveforms 24A and 24B depict the voltages at the output terminals of the bridge amplifier.

The waveforms 26 and 27 represent respectively the voltage at the node designated as VBRIDGE and the common mode voltage at the full bridge stage terminals. It can be noted that the voltage of waveform 26 is always slightly higher than the voltage of waveforms 24A and 24B as desired to obtain high efficiency for the amplifier. The waveform 28 represents the load current and, as expected, it follows the input signal waveform 25 independently from the BEMF voltage applied.

Note that the applied regulated bridge supply is not related to the input signal, but rather to a combination of the BEMF voltage and the input signal in order to maintain adequate current regulation. This is an important distinction from the input-derived prior art.

E. FIG. 6

Figure 6:
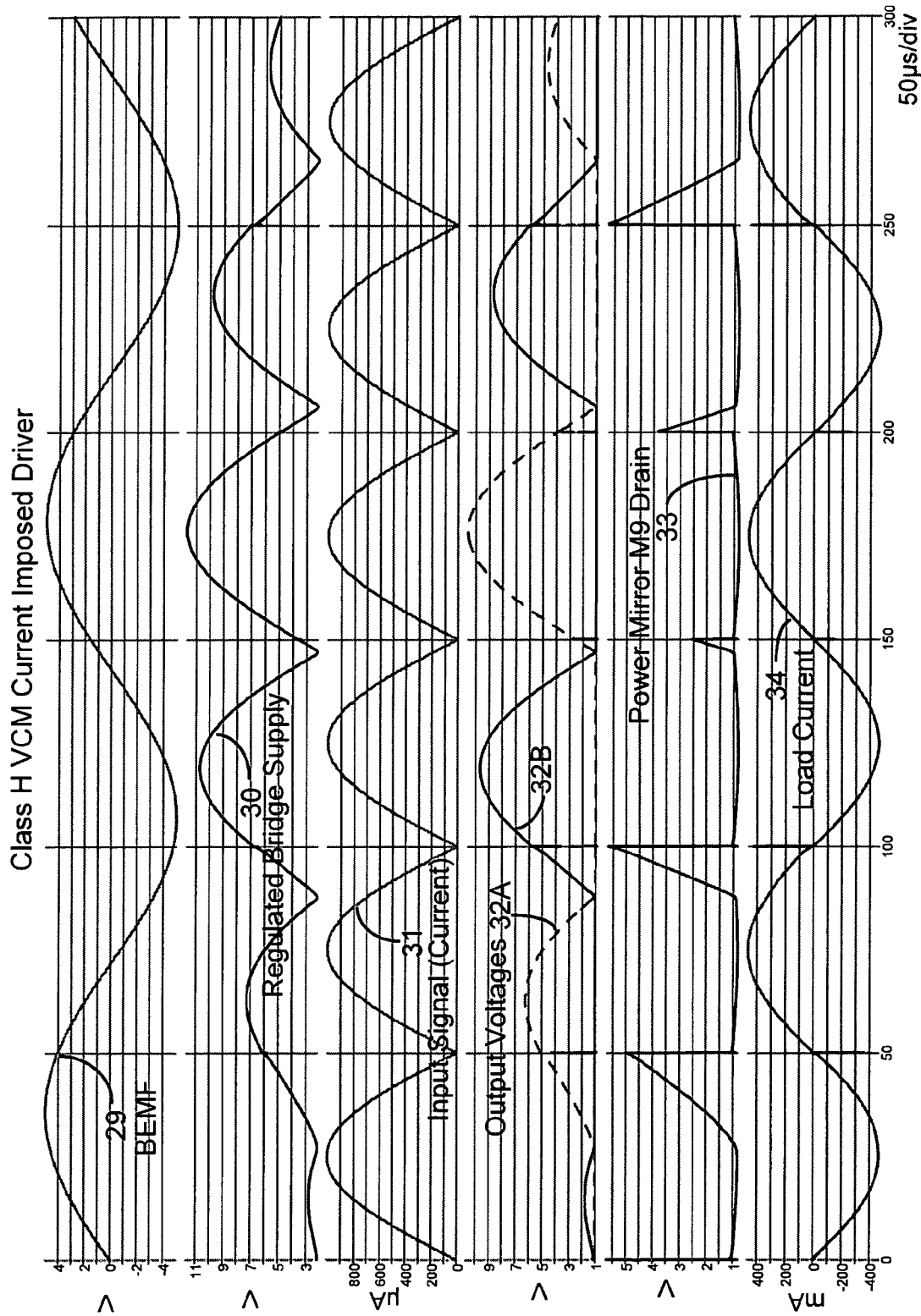
FIG. 6 is showing the most important waveforms of the class H stage of a VCM drive system in the case of sinusoidal input signal and lower frequency sinusoidal BEMF voltage in accordance to the embodiment of FIG. 4.

FIG. 6 depicts the most important waveforms of the class H stage of a VCM drive system in the case of sinusoidal input signal, lower frequency sinusoidal BEMF voltage 29 and resistive load in accordance to the embodiment of FIG. 4. The input signal for this embodiment is a current, indicated as the output of the current DAC 16 of FIG. 4 and represented in FIG. 6 with waveform 31. As previously noted it is always positive. The waveforms 32A and 32B depict the voltages at the output terminals of the bridge amplifier.

The waveform 30 represents the voltage at the node designated as VBRIDGE. It can be noted that the voltage of waveform 30 is always slightly higher than the voltage of waveforms 32A and 32B as desired to obtain high efficiency for the amplifier. The waveform 34 represents the load current and, as expected, it follows the input signal waveform 31 independently from the BEMF voltage applied. The waveform 33 represents the voltage at the drain of the power transistor M9. It can be seen that occasionally it exhibits positive spikes.

F. FIG. 7

Figure 7:
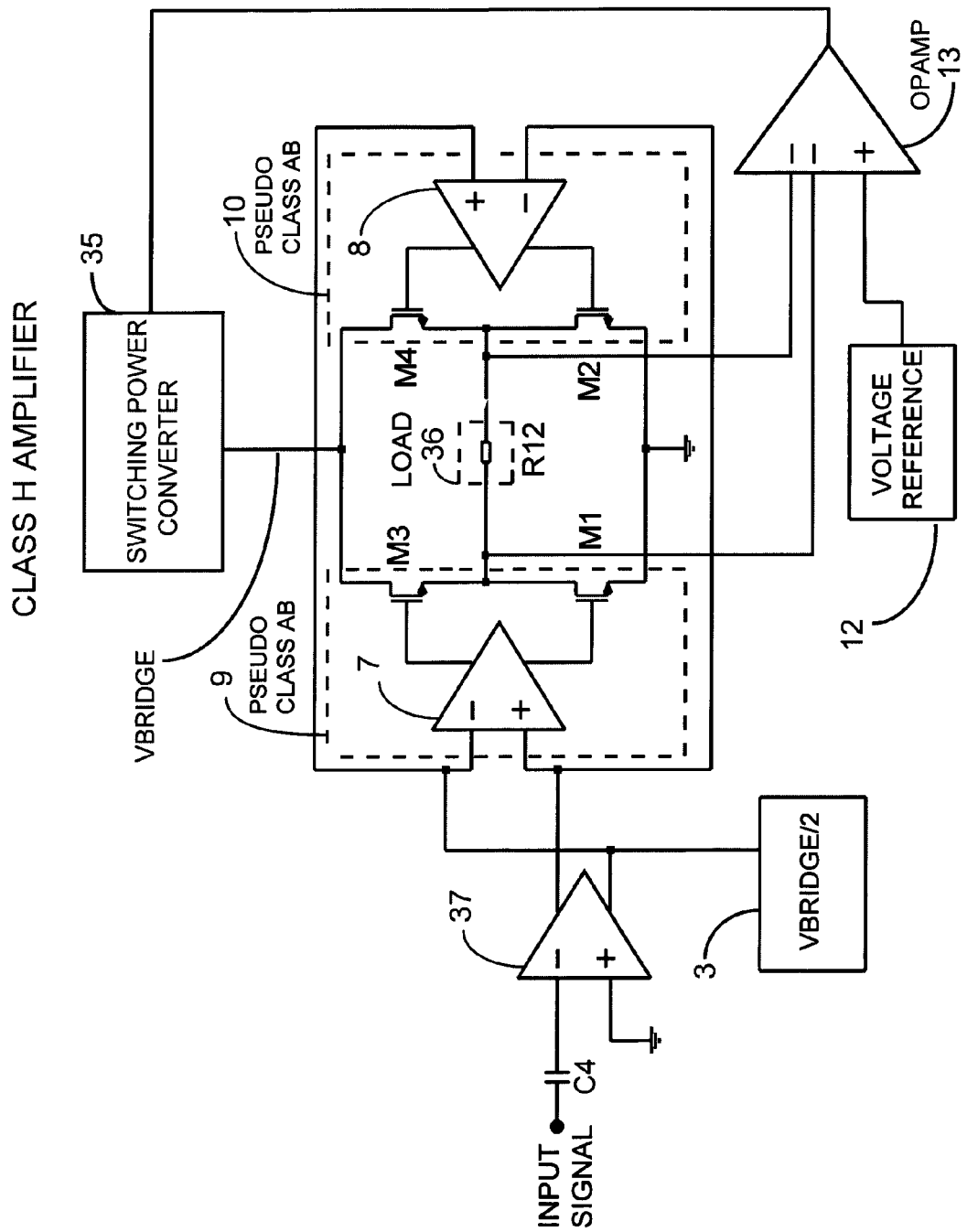
FIG. 7 is a circuit diagram of a general implementation of a closed loop class H bridge amplifier in accordance with another preferred embodiment of the present invention.

FIG. 7 represents a circuit diagram of a general implementation of a closed loop class H bridge amplifier in accordance with another preferred embodiment of the present invention. This implementation can be utilized for various applications including audio applications. The full bridge power stage is driven by two pseudo class AB amplifiers but, more traditionally, class AB amplifiers could be used as well. The load 36 can simply be configured as a resistor R12, as it is often the case for the audio loudspeakers electrical representation. The AC level of the analog input signal is fed into the amplifier through the traditional use of a series capacitor C4. The linear stage is referred to a common mode voltage of a voltage reference 3 that tracks the voltage VBRIDGE/2 varying with the drive conditions.

The switching power converter 35 generates the supply voltage for the output power bridge. The switching power converter can be configured as a step-up, a step-down or a "buck-boost" converter. The buck-boost converter can generate an output voltage lower or higher than its input voltage depending on the desired output voltage. The buck-boost converter could be very useful in battery applications in cases where the amplified audio signal is occasionally required to exceed the current battery voltage.

The switching power converter is controlled by the operational amplifier 13 that regulates the bridge output terminals of the corresponding conducting low side power transistor to be at the same voltage of the voltage reference 12. Effectively the closed loop class H amplifier operates to maintain the common mode output voltage of the bridge amplifier to be the minimum necessary to drive with low distortion the load minimizing the power losses across the power transistors and maximizing the overall amplifier's efficiency.

The feedback constituted by the amplifier 13 and the switching power converter 35 guarantees that the drain-source voltage for the bridge low side conducting transistor is equal to the voltage reference 12. Since the pseudo class AB amplifiers 9 and 10 are typically configured as closed loop amplifiers with a constant gain defined by feedback resistors and since the common mode voltage of the loop tracks the VBRIDGE voltage, the drain-source voltage for the high side conducting transistor is equally regulated to be the voltage reference 12. Therefore both conducting transistors at anyone time operate at the minimum voltage necessary to obtain optimal output voltage control.

Similarly to the previous implementations, the amplifier 13 has two inverting inputs to indicate that, at any time, the lowest voltage input is the one being regulated. The switching power converter 35 has to operate at a high enough frequency to respond quickly to input signal variations in the bandwidth of the input signal itself. Typically this implementation guarantees very low distortion if the bandwidth of the input signal is orders of magnitude lower than the switching frequency of the converter. Operating the converter at high frequency allows the use of inductors and output filter capacitors of low value saving board space. The use of small inductance inductors also allows a fast di/dt when the input signal varies.

The amplifier 37 translates the analog input signal referred to ground to a differential analog signal referred to the common mode voltage VBRIDGE/2 tracking the bridge supply voltage modulated by the feedback system.

This implementation differentiates itself significantly from the prior art mainly because the power converter is controlled by a feedback system. The prior art makes use of open loop systems and the power converters outputs are modulated by the amplitude of the input signal. With the present invention the efficiency can be as high as a class D amplifier monitoring directly the output stage common mode voltage.

In particular, in the case of class D audio amplifiers, with the exclusion of the very low wattage applications, a bulky L-C filter is required at the bridge switching outputs to filter them before applying them to the loudspeaker. These filter inductors have to be large in order to introduce minimal distortion caused by the magnetic core. This filter, in addition to requiring a large board space, it is expensive and often dissipating power, thus reducing the overall system efficiency. The proposed class H amplifier does not require such a filter.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A power amplifying apparatus for power amplifying an input signal comprising:
   a full bridge power circuit having a source terminal, an input terminal and a pair of output terminals;
   a switching power converter coupled to a power source, to the electrical ground terminal and having an input terminal to control the output voltage of said switching power converter, and an output terminal coupled to the source terminal of said full bridge power circuit;
   an amplifier coupled to said output terminals of said full bridge power circuit and having an output terminal coupled to said input terminal of said switching power converter;
   wherein said input signal is applied to said input terminal of said full bridge power circuit;
   wherein said full bridge power circuit comprises a pair of half bridge power amplifiers;
   whereby said amplifier generates a signal coupled to said output terminal of said amplifier whose amplitude is representative of the differential voltage between a voltage reference and the voltage of the output terminals of said full bridge power circuit, and
   whereby the voltage at said output terminal of said switching power converter is regulated to obtain the minimum necessary voltage at said output terminals of said full bridge power circuit to establish the desired current path in a load coupled between said output terminals of said full bridge power circuit.

2. The power amplifying apparatus of claim 1 wherein said load is a motor.

3. The power amplifying apparatus of claim 1 wherein the voltage at the output terminal of said switching power converter is lower than the voltage of said power source.

4. The power amplifying apparatus of claim 1 wherein the voltage at the output terminal of said switching power converter is higher than the voltage of said power source.

5. The power amplifying apparatus of claim 1 wherein the voltage at the output terminal of said switching power converter is either higher or lower than the voltage of said power source.

6. The power amplifying apparatus of claim 1 wherein said load is a motor used in a magnetic or an optical data storage system.

7. The power amplifying apparatus of claim 1 wherein said load is a loudspeaker.

8. A method for achieving efficient driving of a load, comprising:
   generating a first signal representative of the voltage to be applied to said load;
   driving a bridge power amplifier coupled to said load, wherein each half bridge power circuit of said bridge power amplifier is comprising a high side transistor having current path connected between the output terminal of a switching power converter and a terminal of said load and a low side transistor having current path connected between said terminal of said load and the electrical ground terminal;
   receiving said first signal representative of the voltage to be applied to said load;
   applying voltage to said load by means of said half bridge power circuits of said bridge power amplifier depending on the amplitude of said first signal;
   generating a second signal whose amplitude is representative of the differential voltage between a voltage reference and the voltage of the output terminal of said half bridge power circuit whose low side transistor is conducting;
   modulating the voltage at said output terminal of said switching power converter in response to said second signal, and
   whereby the common mode voltage at said terminals of said load and the voltage at said output terminal of said switching power converter are regulated to be the minimum necessary to establish the desired current path through the selected transistors and said load.

9. The method of claim 8 wherein said switching power converter, coupled to a power source, generates a voltage to be applied to said half bridge power circuits that is lower than the voltage of said power source.

10. The method of claim 8 wherein said switching power converter, coupled to a power source, generates a voltage to be applied to said half bridge power circuits that is higher than the voltage of said power source.

11. The method of claim 8 wherein said switching power converter, coupled to a power source, generates a voltage to be applied to said half bridge power circuits that is either higher or lower than the voltage of said power source.

12. The method of claim 8 wherein said voltage reference varies in response to said first signal representative of the voltage to be applied to said load.

13. The method of claim 8 wherein said load is a loudspeaker.

14. A method for achieving efficient current driving of a motor, comprising:
   generating a first signal representative of the current to be applied to said motor;
   driving a bridge power amplifier coupled to said motor, wherein each half bridge power circuit of said bridge power amplifier is comprising a high side transistor having current path connected between the output terminal of a switching power converter and a terminal of said motor and a low side transistor having current path connected between said terminal of said motor and the electrical ground terminal;
   receiving said first signal representative of the current to be applied to said motor;
   applying current to said motor by means of said half bridge power circuits of said bridge power amplifier depending on the amplitude of said first signal;
   generating a second signal whose amplitude is representative of the differential voltage between a voltage reference and the voltage of the output terminal of said half bridge power circuit whose low side transistor is conducting;
   modulating the voltage at said output terminal of said switching power converter in response to said second signal, and
   whereby the common mode voltage at said terminals of said motor and the voltage at said output terminal of said switching power converter are regulated to be the minimum necessary to establish the desired current path through the selected transistors and said motor.

15. The method of claim 14 wherein said low side transistors of said half bridge power circuits have current path connected between said output terminals and a common current source.

16. The method of claim 14 wherein said motor is used in a magnetic or an optical data storage system.

17. The method of claim 14 wherein said switching power converter, coupled to a power source, generates a voltage to be applied to said half bridge power circuits that is lower than the voltage of said power source.

18. The method of claim 14 wherein said switching power converter, coupled to a power source, generates a voltage to be applied to said half bridge power circuits that is higher than the voltage of said power source.

19. The method of claim 14 wherein said switching power converter, coupled to a power source, generates a voltage to be applied to said half bridge power circuits that is either higher or lower than the voltage of said power source.

20. The method of claim 14 wherein said voltage reference varies in response to said first signal representative of the voltage to be applied to said load.

* * * * *